(12) United States Patent
Nozaki et al.

(10) Patent No.: US 7,989,081 B2
(45) Date of Patent: *Aug. 2, 2011

(54) RESIN COMPOSITE COPPER FOIL, PRINTED WIRING BOARD, AND PRODUCTION PROCESSES THEREOF

(75) Inventors: Mitsuru Nozaki, Tokyo (JP); Morio Gaku, Tokyo (JP); Yasuo Tanaka, Tokyo (JP); Eiji Nagata, Yokohama (JP); Yasuo Kikuchi, Yokohama (JP); Masashi Yano, Yokohama (JP)

(73) Assignees: Mitsubishi Gas Chemical Company, Inc., Tokyo (JP); PI R&D Co., Ltd., Kanagawa-ken (JP)

( * ) Notice: Subject to any disclaimer, the term of this patent is extended or adjusted under 35 U.S.C. 154(b) by 1135 days.

This patent is subject to a terminal disclaimer.

(21) Appl. No.: 11/657,529

(22) Filed: Jan. 25, 2007

(65) Prior Publication Data

US 2007/0172674 A1    Jul. 26, 2007

(30) Foreign Application Priority Data

Jan. 25, 2006 (JP) ................................ 2006-016081
Mar. 10, 2006 (JP) ................................ 2006-065010

(51) Int. Cl.
*B32B 15/08* (2006.01)
*B32B 27/06* (2006.01)
*C23C 18/54* (2006.01)

(52) U.S. Cl. ............... 428/473.5; 428/458; 428/901; 427/97.6; 525/420; 525/422; 525/436; 528/340; 528/353

(58) Field of Classification Search ............... 428/473.5, 428/901, 458; 427/97.6; 525/420, 422, 436; 528/340, 353
See application file for complete search history.

(56) References Cited

U.S. PATENT DOCUMENTS

| 4,393,188 | A | * | 7/1983 | Takahashi et al. | 528/88 |
| 5,089,346 | A | * | 2/1992 | Imaizumi et al. | 428/458 |
| 5,200,474 | A | * | 4/1993 | Chen et al. | 525/426 |
| 5,739,263 | A | * | 4/1998 | Yoshida et al. | 528/353 |
| 6,251,507 | B1 | * | 6/2001 | Yamamoto et al. | 428/215 |
| 6,630,064 | B1 | * | 10/2003 | Itatani et al. | 204/489 |

FOREIGN PATENT DOCUMENTS

EP        618269 A1 * 10/1994

* cited by examiner

*Primary Examiner* — Callie E Shosho
*Assistant Examiner* — John Freeman
(74) *Attorney, Agent, or Firm* — Wenderoth, Lind & Ponack, L.L.P.

(57) ABSTRACT

A resin composite copper foil comprising a copper foil and a resin layer containing a block copolymer polyimide and a maleimide compound, the resin layer being formed on one surface of the copper foil, a production process thereof, a copper-clad laminate using the resin composite copper foil, a production process of a printed wiring board using the copper-clad laminate, and a printed wiring board obtained by the above process.

11 Claims, 3 Drawing Sheets

US 7,989,081 B2

RESIN COMPOSITE COPPER FOIL, PRINTED WIRING BOARD, AND PRODUCTION PROCESSES THEREOF

FIELD OF THE INVENTION

The present invention relates to a resin composite copper foil used for printed wiring boards, a process for the production of the resin composite copper foil, a copper-clad laminate using the resin composite copper foil, a printed wiring board using the copper-clad laminate and a process for the production of the printed wiring board. The resin composite copper foil obtained by the present invention is excellent in adhesive strength so that a copper foil having a surface with extremely small roughness can be used. The copper-clad laminate using the above resin composite copper foil is suitably used as a high-density printed wiring board having fine circuits. Further, a printed wiring board obtained by the process of the present invention is excellent in adhesive strength of a copper plating layer or heat resistance so that the printed wiring board is suitably used as a high-density printed wiring board having fine circuits.

BACKGROUND OF THE INVENTION

In recent years, it is required to extremely decrease a circuit conductor width and an insulating space between circuits in printed wiring boards, for mounting electronic parts such as semiconductor parts used for electronic devices and also for achieving super-high densification of semiconductor circuits. Conventionally, electrolytic copper foils having a remarkably-roughened mat surface, which are excellent in copper foil adhesive strength, have been used as copper foils for copper-clad laminates for use in printed wiring boards. These electrolytic copper foils have excellent adhesive strength. However, when a fine circuit is formed using such an electrolytic copper foil by an etching process, parts of convex portions of the copper foil are apt to remain on the surface of a resin for insulation under the influence of the roughness of the copper foil mat surface. When an etching time is prolonged for removing the remaining convex portions completely, the circuit is etched too much so that the location accuracy or adhesive strength of the circuit is decreased.

For overcoming these problems, so-called low-profile copper foils with controlled surface roughness have become commercially practical. When these copper foils are used for copper-clad laminates of high-heat-resistant thermosetting resins, etc., which basically have a weak adhesive strength, the lack of adhesive strength is a problem about fine circuits. This greatly obstructs the formation of ultra-fine lines. In addition, for improving the adhesion strength between a copper foil and a resin for insulation, a method in which an insulating adhesive layer is formed on a copper foil has become commercially practical for a long time. For example, a technology in which a phenol•butyral resin is formed on a copper foil is known in regard to paper phenol resin copper-clad laminates, and a technology in which an epoxy resin adhesive agent is formed on a copper foil is known in regard to glass epoxy resin copper-clad laminates. As specific examples of these adhesive agent-attached copper foils, a copper-clad laminate using a copper foil on which a thin adhesive agent layer is formed (for example, JP-A-8-216340) and a copper-clad laminate using a copper foil to which a semi-cured resin film is bonded (for example, JP-A-9-011397) are proposed. Copper-clad laminates using such adhesive agent-attached copper foils have problems in terms of the degree of adhesive strength or heat resistance after moisture absorption. Therefore, further improvements are required.

SUMMARY OF THE INVENTION

It is an object of the present invention to provide a resin composite copper foil having excellent adhesive strength for which a copper foil having a surface with extremely small roughness can be used and a process for the production of the resin composite copper foil and provide a copper-clad laminate which uses the above resin composite copper foil and is excellent in heat resistance and heat resistance after moisture absorption, a process for the production of a printed wiring board using the above copper-clad laminate, and a printed wiring board obtained by the above process.

It is another object of the present invention to provide a process for the production of a printed wiring board excellent in adhesive strength of a copper plating layer and heat resistance, which process makes it possible to easily form an ultra-fine line circuit.

According to the present invention, there is provided a resin composite copper foil for printed wiring boards, comprising a copper foil and a resin layer containing a block copolymer polyimide and a maleimide compound, the resin layer being formed on one surface of the copper foil.

According to the present invention, there is further provided a resin composite copper foil as defined above, wherein the block copolymer polyimide has a structure unit represented by the formula (1) and a structure unit represented by the formula (2), (1)

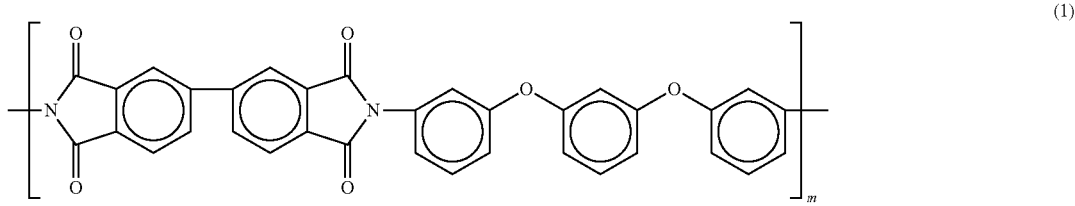

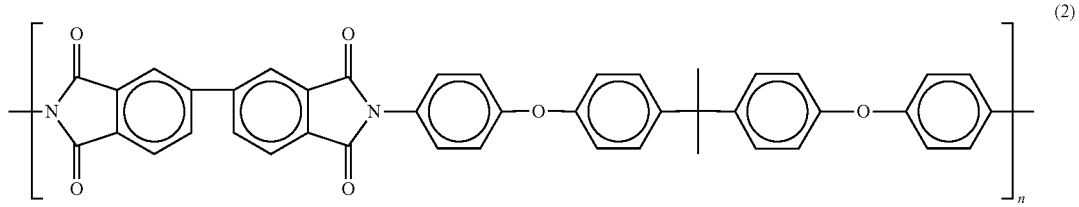

(2)

wherein m and n are integers which satisfy m:n=1:9 to 3:1.

According to the present invention, there is still further provided a process for the production of the above resin composite copper foil for printed wiring boards, comprising applying a resin solution containing the block copolymer polyimide and the maleimide compound to one surface of the copper foil and then heat-treating the resin solution-applied copper foil at 250 to 360° C., to form a resin layer which does not melt at 200° C. or lower.

According to the present invention, there is furthermore provided a copper-clad laminate for printed wiring boards, which is obtained by laminating a resin composite copper foil comprising a copper foil and a resin layer containing a block copolymer polyimide and a maleimide compound, the resin layer being formed on one surface of the copper foil, and a B-stage resin composition layer, and then curing the resultant set.

According to the present invention, there is further provided a process for the production of a printed wiring board, which process comprises completely removing the copper foil of the copper-clad laminate as recited above by etching, to expose a resin layer surface and obtain a laminate, forming an electroless copper plating layer by electroless copper plating without roughening treatment of the resin layer surface of the laminate, then forming an electrolytic copper plating layer on the electroless copper plating layer by electrolytic copper plating, and then selectively removing the electroless copper plating layer and the electrolytic copper plating layer by etching, thereby forming a copper circuit.

According to the present invention, there is further provided a process for the production of a printed wiring board, which process comprises completely removing the copper foil of the copper-clad laminate as recited above by etching, to expose a resin layer surface and obtain a laminate, forming an electroless copper plating layer by electroless copper plating without roughening treatment of the resin layer surface of the laminate, then selectively forming an electrolytic copper plating layer on the electroless copper plating layer, and then removing at least the electroless copper plating layer in a portion where the electrolytic copper plating layer is not formed, by etching, thereby forming a copper circuit.

According to the present invention, there is further provided a process according to each of the above processes, wherein heat-treatment is carried out at 100° C. to 200° C. after the formation of the electroless copper plating layer or the formation of the electrolytic copper plating layer.

According to the present invention, there is further provided a printed wiring board obtained by any one of the above processes.

EFFECT OF THE INVENTION

Figure 1:
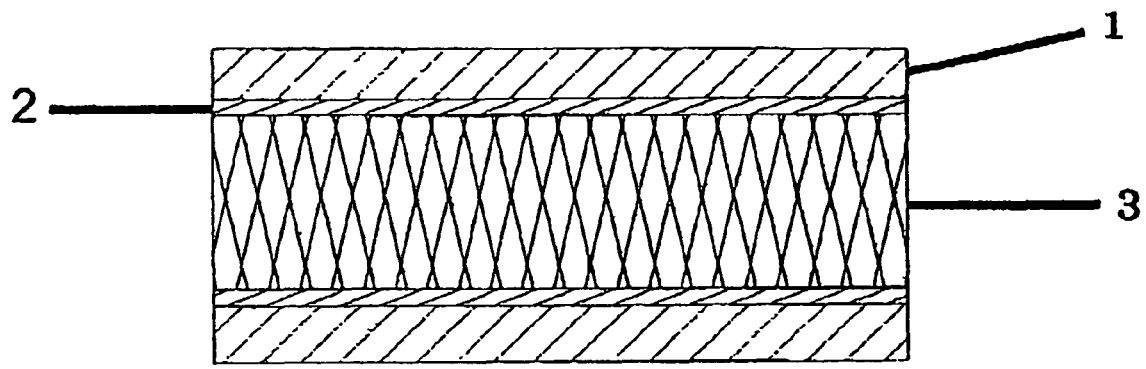
FIG. 1 is an explanatory drawing of a copper-clad laminate used in the present invention.

The resin composite copper foil obtained by the present invention is excellent in adhesive strength so that a copper foil having a surface with extremely small roughness can be used. By using the above resin composite copper foil, a copper-clad laminate excellent in heat resistance and heat resistance after moisture absorption can be obtained. This copper-clad laminate is suitably used as a high-density printed wiring board having a fine circuit so that the industrial utilities of the resin composite copper foil and the process for the production of the resin composite copper foil, provided by the present invention, are remarkably high.

A printed wiring board obtained by the process of the production of a printed wiring board, provided by the present invention, enables an ultra-fine line (approximately 12 μm in width) copper circuit to be formed. The above circuit width is remarkably smaller than a conventional fine line circuit width. Further, the above printed wiring board is excellent in adhesive strength and heat resistance after moisture absorption. Therefore, the above printed wiring board is suitable as a high-density printed wiring board having a fine circuit, and the practical utilities of the technology of the present invention are remarkably high.

DETAILED DESCRIPTION OF THE INVENTION

The present inventors have made diligent studies for overcoming the before-described problems of the conventional art and found that a copper-clad laminate excellent in adhesive strength and heat resistance can be obtained by using a resin composite copper foil comprising a copper foil and a resin layer containing a specific block copolymer polyimide and a specific maleimide compound, formed on one surface of the copper foil. On the basis of the above finding, the present inventors have reached the present invention. That is, the present invention provides a resin composite copper foil comprising a copper foil and a resin layer containing a block copolymer polyimide and a maleimide compound, the resin layer being formed on one surface of the copper foil. The block copolymer polyimide is preferably a block copolymer polyimide having a structure unit represented by the formula (1) and a structure unit represented by the formula (2). The thickness of the resin layer is preferably 0.1 μm to 10 μm. The weight ratio of the block copolymer polyimide: the maleimide compound contained in the resin layer is preferably 10:90 to 90:10.

The present invention further provides a process for the production of a resin composite copper foil, which process comprises applying a resin solution containing a block copolymer polyimide as recited above and a maleimide compound as recited above to one surface of a copper foil and then heat-treating the resin solution-applied copper foil at a temperature in the range of from 250 to 360° C. The present invention still further provides a copper-clad laminate obtained by combining the above resin composite copper foil and a B-stage resin composition layer and curing the resultant set, and a printed wiring board using the above copper-clad laminate.

The present inventors have further found that a printed wiring board excellent in adhesive strength and heat resistance is obtained by using a copper-clad laminate using a specific resin composite copper foil, removing a copper foil by etching to expose a resin layer surface, forming a copper plating layer without roughening treatment of the resin layer surface, and then selectively removing the copper plating layer by etching to form a copper circuit.

The block copolymer polyimide which is preferably used in the resin layer of the resin composite copper foil of the present invention is not specially limited so long as it is a copolymer polyimide having a structure in which an imide oligomer formed of a second structural unit is bonded to a terminal of an imide oligomer formed of a first structural unit. The block copolymer polyimide is synthesized by a sequential polymerization reaction in which a tetracarboxylic dianhydride is reacted with a diamine in a polar solvent to obtain an imide oligomer and then the same kind of tetracarboxylic dianhydride and a different kind of diamine are further added or a different kind of tetracarboxylic dianhydride and the same kind of diamine are further added, to carry out imidization.

The polar solvent to be used includes polar solvents which dissolve polyimide such as N-methyl-2-pyrrolidone, dimethylacetamide, dimethylformamide, dimethyl sulfoxide, sulfolane and tetramethyl urea. Further, it is possible to mix a ketone solvent or an ether solvent with the above polar solvent. The ketone solvent which can be used in the present invention includes methyl ethyl ketone, methyl propyl ketone, methyl isopropyl ketone, methyl butyl ketone, methyl isobutyl ketone, methyl-n-hexylketone, diethyl ketone, diisopropyl ketone, diisobutyl ketone, cyclopentanone, cyclohexanone, methyl cyclohexanone, acetylacetone, diacetone alcohol and cyclohexene-n-on. The ether solvent which can be used in the present invention includes dipropyl ether, diisopropyl ether, dibutyl ether, tetrahydrofuran, tetrahydropyran, ethyl isoamyl alcohol, ethyl-t-butylether, ethyl benzyl ether, diethylene glycol dimethyl ether, cresyl methyl ether, anisole and phenetole. Further, for the purpose of removing water which generates in the imidization reaction, it is required to add a solvent which is azeotropic with water such as toluene or xylene and remove the generated water from the reaction solution. Further, an amine catalyst such as pyridine or a binary catalyst composed of a base and a cyclic ester such as pyridine and γ-valerolactone is preferably used for the purpose of promoting the reaction. The reaction temperature is 120 to 200° C. A polar solvent solution of the block copolymer polyimide alone can be obtained by finally distilling off the solvent which is azeotropic with water such as toluene or xylene and the catalyst such as pyridine from the reaction solution.

The block copolymer polyimide used in the present invention is preferably a solvent-soluble block copolymer polyimide having a structural unit of the formula (1) and a structural unit of the formula (2). For the above block copolymer polyimide, 3,4,3',4'-biphenyltetracarboxylic dianhydride is used as the tetracarboxylic dianhydride and 1,3-bis(3-aminophenoxy)benzene and 2,2-bis{4-(4-aminophenoxy)phenyl}propane are used as the diamine.

For the purpose of controlling the molecular weight of each unit polycondensate, the molar ratio between the tetracarboxylic dianhydride and the diamine is shifted in a first-stage reaction to convert a terminal into an acid anhydride or an amine and then the molar ratio, used in the first-stage reaction, between the tetracarboxylic dianhydride and the diamine is reversed in a second-stage reaction, whereby a block copolymer polyimide having a sufficient molecular weight can be obtained. The weight average molecular weight (Mw) of the block copolymer polyimide of the present invention is preferably 50,000 to 300,000, more preferably 80,000 to 200,000. When Mw is smaller than 50,000, the resin layer is fragile and therefore is not suitable for the object of the present invention. When Mw is larger than 300,000, a resin solution viscosity becomes too high and therefore its application is difficult. The molar ratio of the tetracarboxylic dianhydride and the diamine can be shifted in the synthesis of the block copolymer polyimide for the purpose of controlling the final molecular weight.

The molar ratio between unit polycondensate of the formula (1): unit polyconderisate of the formula (2) is preferably from 1:9 to 3:1, more preferably from 1:3 to 3:1. When the percentage of the structure of the formula (1) is less than 10 mol %, a problem is a decrease in adhesive strength. When the percentage of the structure of the formula (2) is less than 25 mol %, a problem is a decrease in soldering heat resistance.

The maleimide compound used in the resin layer of the resin composite copper foil of the present invention is not specially limited so long as it is a compound having at least two maleimide groups per molecule. Preferable examples thereof include bis(4-maleimidophenyl)methane, 2,2-bis[4-(4-maleimidophenoxy)phenyl]propane, polyphenyl methane maleimide, m-phenylene bismaleimide, bisphenol A diphenyl ether bismaleimide and 3,3'-dimethyl-5,5'-diethyl-4,4'-diphenyl methane bismaleimide. These maleimide compounds may be used alone or in combination, as required. Further, a prepolymer of the maleimide compound, a prepolymer of the maleimide compound with an amine compound, etc., can be used.

The weight ratio of the block copolymer polyimide and the maleimide compound contained in the resin layer of the resin composite copper foil is preferably 10:90 to 90:10, more preferably 20:80 to 80:20.

The copper foil used in the resin composite copper foil of the present invention is not specially limited so long as it is a known copper foil usable for printed wiring boards. An electrolytic copper foil, a rolled copper foil and copper alloys of these are preferably used. These copper foils may be surface-treated by known treatment such as treatment with nickel or cobalt or treatment with a silane-treating agent. The thickness of the copper foil is not specially limited. It is preferably 35 μm or less. The surface roughness (Rz) of a copper foil surface on which the resin layer is to be formed is preferably 4 μm or less, more preferably 2 μm or less. In the present invention, Rz is a 10-points average roughness defined by JIS B0601.

The thickness of the resin layer of the resin composite copper foil of the present invention can be adjusted in accordance with the degree of the surface roughness of the copper foil. When the thickness of the resin layer is too thick, drying in a thermally drying step after the application to the copper foil is apt to be insufficient so that the heat resistance of a copper-clad laminate using such a resin composite copper foil is decreased in some cases. Therefore, the thickness of the resin layer is preferably 0.1 to 10 μm, more preferably 1 to 7 μm.

The resin composite copper foil of the present invention is produced by applying a resin solution containing the block copolymer polyimide, obtained according to the aforementioned synthesis method, and the maleimide compound to the copper foil and drying the applied solution under heat. As an application method, a variety of methods can be used such as reverse roll, rod (bar), blade, knife, die, gravure and rotary screen. The method of the drying under heat is not specially limited so long as it is capable of generating a temperature sufficient for removing a solvent used in the resin solution. A hot-air dryer or an infrared ray dryer is typically used. For preventing the oxidation of copper, it is preferred to carry out heat treatment in vacuum or in an inert atmosphere such as nitrogen. Further, it is preferred that the temperature of the heat treatment is finally in the range of 250 to 360° C. When it is lower than the above lower limit or higher than the upper limit, the heat resistance after moisture absorption of a copper-clad laminate using the thus-obtained resin composite copper foil tends to decrease.

An example of a specific method of producing the resin composite copper foil is as follows. The maleimide compound is added to a polar solvent solution of the block copolymer polyimide, the maleimide compound is dissolved and mixed in the polar solvent solution by stirring at room temperature or under heat, the thus-obtained resin solution is applied to one surface of the copper foil, and then the resin-solution-applied copper foil is dried under heat in a nitrogen atmosphere at 120 to 180° C. for 3 to 10 minutes and then further heat-treated in a nitrogen atmosphere at 250° C. to 360° C. for 1 to 3 minutes, thereby producing the resin composite copper foil.

A resin composition used in the B-stage resin composition layer to be combined with the resin composite copper foil of the present invention is not specially limited so long as it is a known thermosetting resin composition usable for printed wiring boards. Examples of such a resin include an epoxy resin, polyimide, a cyanate ester resin, a maleimide resin, a double-bond-added polyphenylene ether resin, and resin compositions such as bromine- or phosphorus-containing compounds of these resins. These may be used alone or in combination. It is preferable to use a resin composition containing a cyanate ester resin as an essential component, such as a resin composition containing an epoxy resin in combination with the cyanate ester resin, in view of reliability such as migration resistance and heat resistance. A known catalyst, a known curing agent or a known curing accelerator can be used for these thermosetting resins as required.

The cyanate ester resin which is preferably used in the resin composition used in the B-stage resin composition layer refers to a compound having at least two cyanato groups per molecule. Specific examples of the cyanate ester resin includes 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-cyanatophenyl)methane, 2,2-bis(4-cyanatophenyl)propane, 2,2-bis(3,5-dibromo-4-cyanotophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, and a variety of cyanate ester resins obtained by reaction between a novolak resin and cyan halide. These may be used alone or in combination.

The epoxy resin which is preferably used in combination with the cyanate ester resin can be selected from known epoxy resins. Specific examples of the epoxy resin include a bisphenol A type epoxy resin, a bisphenol F type epoxy resin, a phenol novolak type epoxy resin, a cresol novolak type epoxy resin, an alicyclic epoxy resin, a biphenyl type epoxy resin, a fluorene type epoxy resin, a resorcine type epoxy resin, a naphthalene type epoxy resin, a phenol aralkyl type epoxy resin, a biphenyl aralkyl type epoxy resin, an epoxydized polyphenylene ether resin; polyepoxy compounds prepared by epoxidizing the double bond of butadiene, pentadiene, vinylcyclohexene, dicyclopentyl ether or the like; and polyglycidyl compounds obtained by a reaction of polyol, hydroxyl-group-containing silicone resins and epichlorohydrin. Further, known bromine-added resins of these epoxy resins and a phosphorus-containing epoxy resin may be also used. These epoxy resins may be used alone or in combination as required.

The method for producing the B-stage resin composition layer used in the present invention is not specially limited. For example, the B-stage resin composition layer is produced by a known method such as a method in which a varnish of a thermosetting resin composition is prepared by dissolving or dispersing the thermosetting resin composition in a solvent or by using no solvent, and the varnish is applied to one surface of a release film and dried to obtain a B-stage resin composition sheet, a method in which the above varnish is applied to a base material and then B-staged by drying to prepare a prepreg or a method in which the above varnish is directly applied to a substrate having a conductor circuit formed and then dried to form the B-stage resin composition layer. The thickness of the B-stage resin composition layer is not specially limited. In the case of the sheet or the application, the above thickness is preferably 4 to 150 μm. In the case of the prepreg, the thickness is preferably 10 to 200 μm.

It is preferred to use a base material in the B-stage resin composition layer used in the present invention from the viewpoint of the properties of the copper-clad laminate to be obtained. The base material is not specially limited so long as it is a known base material usable for printed wiring boards. Specific examples of the base material include nonwoven fabrics and woven fabrics of known glass fibers such as E glass, NE glass, D glass, S glass and T glass. For improving the adhesion to the resin composition, it is preferred that the base material is treated by known surface treatment.

The method of producing the copper-clad laminate in the present invention is a method in which the aforesaid resin composite copper foil is disposed on the above B-stage resin composition layer such that the resin layer surface of the resin composite copper foil faces to the B-stage resin composition layer and the resultant set is laminate-molded. Specifically, the resin composite copper foil is disposed on at least one surface of the B-stage resin composition layer or a material obtained by disposing or forming the B-stage resin composition layers on both surfaces of a laminate, one B-stage resin composition layer on each surface, such that the resin layer surface of the resin composite copper foil faces to the B-stage resin composition layer, and the resultant set is laminate-molded under heat and under pressure, preferably in vacuum, to obtain a copper-clad laminate. For producing a multilayer board, the B-stage resin composition layers are disposed or formed on both surfaces of an internal layer substrate having conductor circuits formed, one B-stage resin composition layer on each surface, the resin composite copper foils are disposed on the B-stage resin composition layers on both the surfaces, one resin composite copper foil on each surface, such that the resin layer surfaces of the resin composite copper foils face to the B-stage resin composition layers respectively, and the resultant set is laminate-molded under heat and under pressure, preferably in vacuum, to obtain a multilayer copper-clad laminate. A conductor circuit is formed in the above copper-clad laminate or multilayer copper-clad laminate by a known method, and then plating treatment, etc., is carried out to obtain a printed wiring board.

The laminate or circuit substrate used for the above productions is not specially limited in kind and can be selected from known laminates and metal-foil-clad boards, preferably copper-clad boards, for printed wiring board materials. Specific examples thereof include an inorganic-fiber and/or organic-fiber base material copper-clad laminate using a thermosetting resin composition and/or a thermoplastic resin composition, a heat-resistant film base material copper-clad board, composite base material copper-clad laminates obtained by combining these base materials, multilayer copper-clad boards of these, and a multilayer copper-clad board produced by an additive process or the like. The conductor thickness of the circuit substrate is not specially limited. It is preferably 3 to 35 μm. A known treatment which increases the adhesion to the resin of the B-stage resin composition layer, such as black copper oxide treatment or treatment with a chemical (for example, CZ treatment by MECK), is preferably made on the above conductor circuit.

Lamination conditions for the production of the copper-clad laminate are not specially limited. The laminate-molding is preferably carried out at a temperature of 100 to 250° C. at a pressure of 5 to 40 kgf/cm$^2$ under a vacuum degree of 30 mmHg or less for 30 minutes to 5 hours. The lamination may be carried out under the above conditions from first to last. It is also possible to carry out laminate-molding till gelation, then take out a resultant material and post-cure it in a heating furnace.

As a copper foil of copper-clad laminates used for printed wiring boards, a copper foil having roughness formed on a copper foil surface to be bonded, for securing the adhesive strength of the copper foil, and having a rust-preventive plating layer is generally used. However, when a fine line circuit is formed by etching, the limit of the width of a formable fine line circuit is about 50 μm because copper of a convex portion of the roughness of the copper foil remains and because the cross section of the copper circuit is apt to be in the form of trapezoid since the speed of etching the rust-preventive plating layer is slow. Further, as a method for forming a finer line, there is a pattern plating process in which an about-25 μm-thick copper fine line is selectively formed on a laminate having an about-3 μm-thick ultra-thin copper foil by plating and then the copper on the entire surface is etched by about 5 μm, thereby forming a copper fine line. Even according to the pattern plating process, a convex portion of roughness remains and the speed of etching the rust-preventive plating layer is slow so that it is difficult to form a copper circuit having a width of less than about 30 μm.

Figure 2:
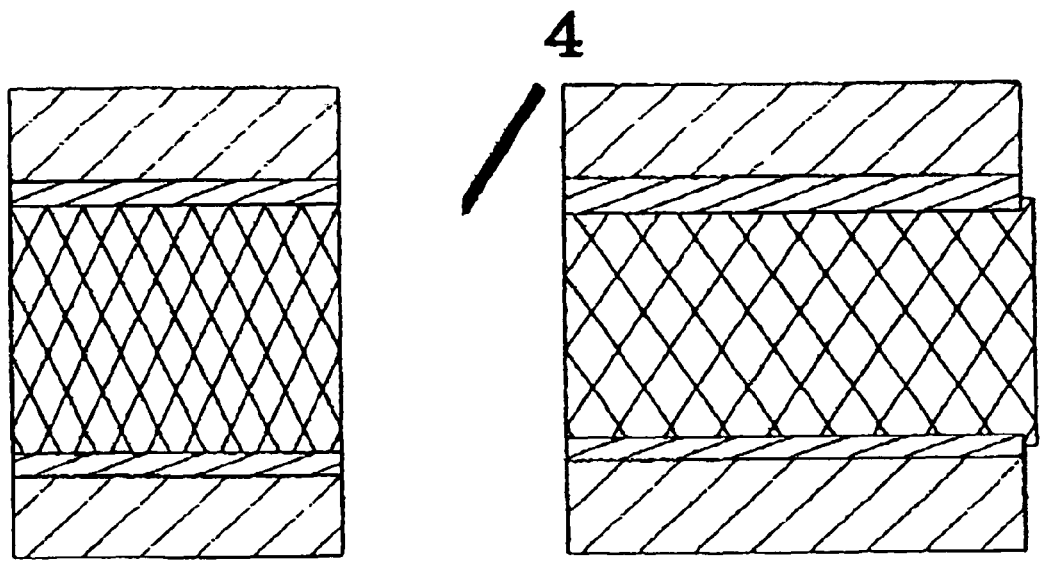
FIG. 2 is an explanatory drawing of a copper-clad laminate in which a through hole is formed.
Figure 3:
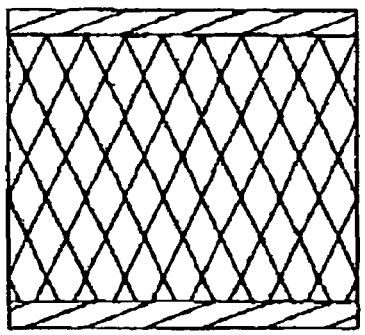
FIG. 3 is an explanatory drawing of a laminate of which a resin layer surface is exposed by removing a copper foil.
Figure 3:
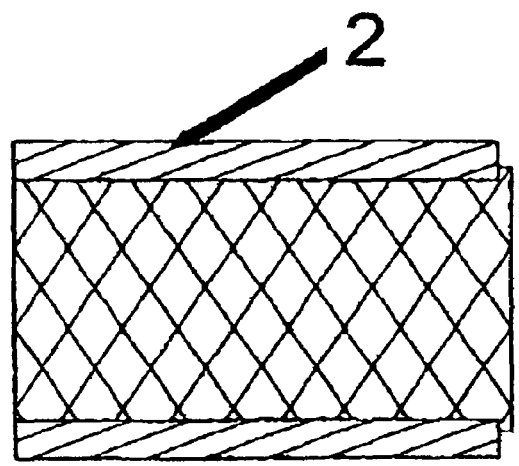
Figure 4:
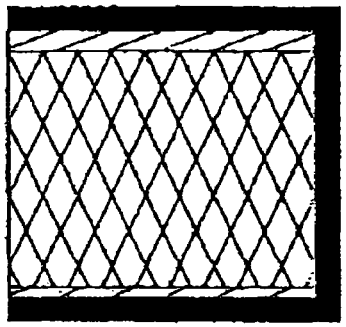
FIG. 4 is an explanatory drawing of a laminate in which an electroless copper plating layer is formed on the resin layer surface.
Figure 4:
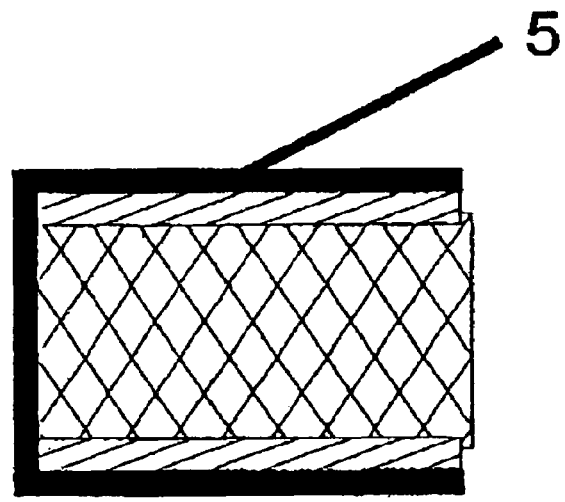
Figure 5:
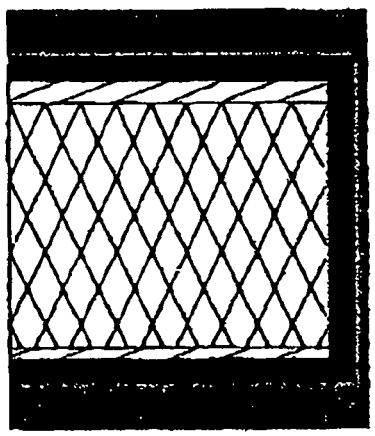
FIG. 5 is an explanatory drawing of a laminate in which an electrolytic copper plating layer is formed on the electroless copper plating layer.
Figure 5:
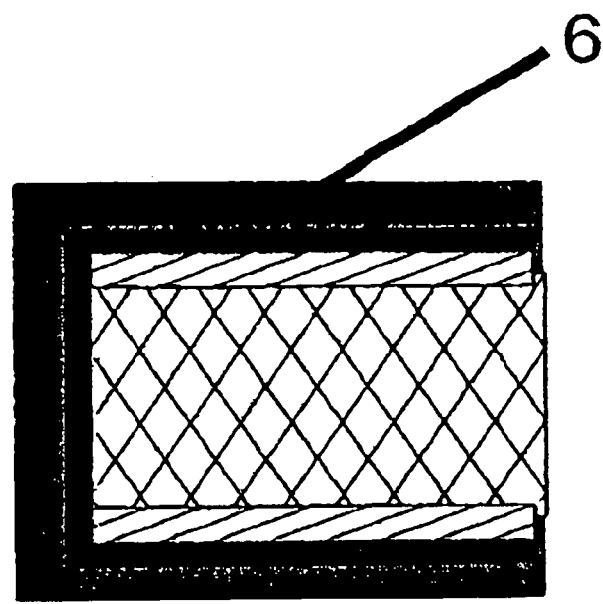
Figure 6:
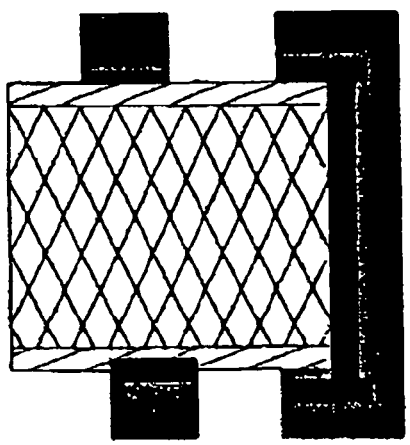
FIG. 6 is an explanatory drawing of a printed wiring board in which the electroless copper plating layer and the electrolytic copper plating layer have been selectively removed.
Figure 6:
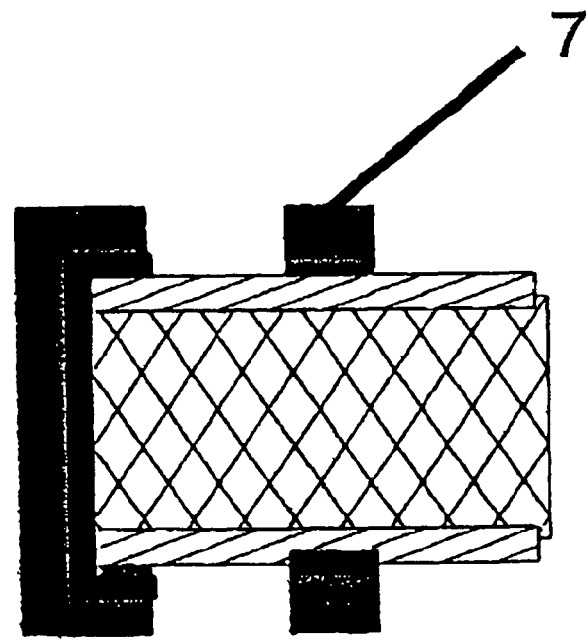

Then, the present invention will be explained with reference to Drawings. The present invention relates to a process for the production of a printed wiring board which overcomes the problems of limitations on the formation of fine lines and low adhesive strength of copper circuits in the circuit formation of copper-clad laminates. The present invention relates to a process for the production of a printed wiring board comprising forming a resin layer (2 in FIG. 1) containing a block copolymer polyimide and a maleimide compound on one surface of a copper foil (1 in FIG. 1) to prepare a resin composite copper foil, stacking a B-stage resin composition layer (3 in FIG. 1) on the surface of the resin layer of the resin composite copper foil, then laminate-molding the resultant set to form a copper-clad laminate, completely removing the copper foil of the copper-clad laminate by etching, to expose the resin layer surface (2 in FIG. 3) and to form a laminate, forming an electroless copper plating layer (5 in FIG. 4) by electroless copper plating without roughening treatment of the surface of the resin layer of the laminate, then forming an electrolytic copper plating layer (6 in FIG. 5) on the electroless copper plating layer by electrolytic copper plating, and then selectively removing the electroless copper plating layer and the electrolytic copper plating layer by etching, thereby forming a copper circuit (7 in FIG. 6). A through hole or a blind hole (4 in FIG. 2) may be formed as required.

There are two general methods for forming copper circuits by selectively removing plating copper layers by etching. One of the above methods is a method in which a portion of a copper plating layer where a copper circuit is to be formed is covered with an etching resist and the circuit is formed by a known etching method. The other is a method in which a thin electroless copper plating layer is formed on the entire surface of a laminate, the electroless copper plating layer in a portion other than a portion where a copper circuit is to be formed is covered with a plating resist, an electrolytic copper plating layer is formed by pattern plating, then the plating resist is peeled off, and at least the electroless copper plating layer on which the electrolytic copper plating layer is not formed is etched, thereby forming the circuit.

The electroless copper plating layer in the printed wiring board of the present invention has a high adhesive strength owing to the resin layer which is previously formed in the resin composite copper foil (the adhesion between the above resin layer and thermosetting resin composition is obtained owing to the adhesive strength of the B-stage resin composition). The adhesive strength of the copper plating layer can be further improved by carrying out heat-treatment at 100° C. to 200° C. after the electroless copper plating or electrolytic copper plating. The printed wiring board of the present invention also has remarkably excellent heat resistance in parts-mounting properties such as solder reflow after moisture absorption.

In the process for the production of a printed wiring board, provided by the present invention, first, a hole such as a through hole or a blind bia is made in the aforesaid copper-clad laminate with a drill, a laser or the like, desmearing treatment is carried out with permanganates as required, to prepare a hole-processed copper-clad laminate, and then the copper foil is entirely removed by etching. The method of removing the copper foil by etching is not specially limited concerning the kind of an etching liquid. Known methods can be used.

Then, electroless copper plating is carried out without carrying out roughening treatment of the resin layer surface, which is exposed, of the laminate. In regard to production processes of printed wiring boards in which conductor layers are formed by copper plating, generally, for the purpose of securing the adhesive strength between a copper plating layer and a curable resin, it is required to form roughness on the surface of the resin by etching the resin with a permanganate or the like. However, the present invention is characterized in that no roughening treatment is required. The method of the electroless copper plating can be selected from known methods. Generally, a palladium catalyst is formed on the surface of the above resin layer and then the resultant laminate is immersed in an electroless copper plating liquid, thereby forming a copper layer having a thickness of 0.5 to 2 μm. Then, the entire surface is plated by electrolytic copper plating, and etching is carried out to form a strongly-bonded copper circuit. Otherwise, the strongly-bonded copper circuit is formed by selectively attaching electrolytic copper plating and then etching and removing the resultant copper surface by at least a thickness corresponding to the thickness of the electroless copper plating layer. The thickness of the electrolytic copper plating is selected as required. In this case, for the purpose of further improving the adhesive strength of the copper plating layer, heat-treatment is preferably carried out at 100° C. to 200° C. after the formation of the electroless copper plating layer or the formation of electrolytic copper plating layer. The period of time of the heat treatment is not specially limited. It is preferably 30 minutes to 5 hours. For preventing the oxidation of the copper foil, heating in vacuum or in an inert gas is preferable.

The subsequent copper circuit formation is carried out according to a known subtractive process or pattern plating process, thereby preparing the printed wiring board. Specifically, when a pattern is formed by the subtractive process, the printed wiring board is produced by covering a portion where the copper circuit is to be formed, on the copper plating layer(s) with etching resist and selectively removing the copper plating layer(s) by a known etching method to form the circuit pattern. When a pattern is formed by the pattern plating process, the printed wiring board is produced by forming an electroless copper plating layer having a thickness of about 0.5 to 1 μm, then selectively covering, with a plating resist, a portion other than a portion where the copper circuit is to be formed, forming an electrolytic copper plating layer having a thickness of about 10 to 30 μm by pattern plating, then peeling off the plating resist, and then etching at least the electroless copper plating layer on which the electrolytic copper plating layer has not been formed, to form the pattern.

EXAMPLES

The present invention will be specifically explained with reference to Synthetic Example, Comparative Synthetic Example, Examples and Comparative Examples, hereinafter.

Synthetic Example

A 2-liter three-necked flask having an anchor type stirring rod made of stainless steel, a trap equipped with a nitrogen-introducing tube and a stopcock, and a reflux condenser having a cooling tube with a ball, installed on the trap, was charged with 117.68 g (400 mmol) of 3,4,3',4'-biphenyltetracarboxylic dianhydride, 87.7 g (300 mmol) of 1,3-bis(3-aminophenoxy)benzene, 4.0 g (40 mmol) of γ-valerolactone, 4.8 g (60 mmol) of pyridine, 300 g of N-methyl-2-pyrrolidone (to be referred to as "NMP" hereinafter) and 20 g of toluene. The mixture was heated at 180° C. for 1 hour and then cooled down to about room temperature. 29.42 g (100 mmol) of 3,4,3',4'-biphenyltetracarboxylic dianhydride, 82.12 g (200 mmol) of 2,2-bis{4-(4-aminophenoxy)phenyl}propane, 200 g of NMP and 40 g of toluene were added and the components were mixed at room temperature for 1 hour and then heated at 180° C. for 3 hours, to obtain a block copolymer polyimide having a solid content of 38%. The block copolymer polyimide had a formula (1): formula (2) ratio of 3:2, a number average molecular weight of 70,000 and a weight average molecular weight of 150,000.

Comparative Synthetic Example

A 2-liter three-necked flask having an anchor type stirring rod made of stainless steel, a trap equipped with a nitrogen-introducing tube and a stopcock, and a reflux condenser having a cooling tube with a ball, installed on the trap, was charged with 164 g (400 mmol) of ethylene glycol bistrimellitate dianhydride, 124 g (400 mmol) of 4,4'-diamino-3,3',5,5'-tetraethyldiphenylmethane, 4.0 g (40 mmol) of γ-valerolactone, 4.8 g (60 mmol) of pyridine, 300 g of NMP and 20 g of toluene. The mixture was heated at 180° C. for 3 hours, to obtain a polyimide having a solid content of 48%. The polyimide had a number average molecular weight of 31,000 and a weight average molecular weight of 78,000.

Examples 1-4

The block copolymer polyimide solution obtained in Synthetic Example was further diluted with NMP to prepare a block copolymer polyimide solution having a solid content of 10%. This block copolymer polyimide solution and bis(4-maleimidophenyl)methane (BMI-H, supplied by K I KASEI KK) were molten and mixed at 60° C. for 20 minutes in accordance with solid content weight ratios shown in Table 1, thereby preparing resin solutions respectively. The thus-prepared resin solutions were respectively applied to a mat surface of an electrolytic copper foil (F0-WS foil, Rz=1.5 μm, supplied by Furukawa circuit foil Co., Ltd.) having a thickness of 12 μm with a reverse roll coating machine, then dried under a nitrogen atmosphere at 120° C. for 3 minutes and 160° C. for 3 minutes and then lastly heat-treated at 300° C. for 2 minutes, thereby preparing resin composite copper foils respectively. On the other hand, 400 g of 2,2-bis(4-cyanatophenyl)propane was molten at 150° C. and allowed to react with stirring for 4 hours, the resultant reaction product was dissolved in methyl ethyl ketone and 600 g of a brominated bisphenol A type epoxy resin (EPICLON 1123P, supplied by Dainippon Ink and Chemicals, Incorporated) and 0.1 part of zinc octylate were added to prepare a varnish. The varnish was impregnated into a glass woven fabric base material having a thickness of 100 μm and dried at 150° C. for 6 minutes, whereby B-stage resin composition layers (prepregs) having a resin amount of 45%, a thickness of 105 μm and a gelation time (at 170° C.) of 120 seconds were prepared. Four prepregs were stacked. The resin composite copper foils of the same kind, obtained above, were placed on the upper surface and lower surface of the stacked prepregs, one resin composite copper foil on each surface, such that the resin layer surfaces of the resin composite copper foils faced to the upper and lower surfaces of the stacked prepregs, and the resultant set was laminate-molded at a temperature of 220° C. at a pressure of 40 kgf/cm$^2$ and under a vacuum degree of 30 mmHg or less for 1 hour, whereby copper-clad laminates having a thickness of 0.4 mm were respectively produced. Table 1 shows the evaluation results.

Example 5

A resin composite copper foil and a copper-clad laminate were produced in the same manner as in Example 3 except that a resin solution was prepared by using 2,2-bis[4-(4-maleimidophenoxy)phenyl]propane (BMI-80, supplied by K I KASEI KK) in place of bis(4-maleimidophenyl)methane used in Example 3. Table 1 shows the evaluation results.

TABLE 1

| | | Evaluation Results | | | | |
|---|---|---|---|---|---|---|
| | | Ex. 1 | Ex. 2 | Ex. 3 | Ex. 4 | Ex. 5 |
| Resin composite copper foil | Block copolymer polyimide | 80 | 65 | 50 | 25 | 50 |
| | Maleimide compound BMI-H | 20 | 35 | 50 | 75 | — |
| | Maleimide compound BMI-80 | — | — | — | — | 50 |
| | Total thickness (μm) | 16 | 15 | 15 | 15 | 15 |
| Copper foil adhesive strength (kg/cm) | | 1.29 | 1.44 | 1.73 | 1.75 | 1.73 |
| Heat resistance in air | 240° C. treatment | ooo | ooo | ooo | ooo | ooo |
| | 280° C. treatment | oox | ooo | ooo | ooo | ooo |
| Heat resistance after moisture absorption | 1 hour | ooo | ooo | ooo | ooo | ooo |
| | 3 hours | ooo | ooo | ooo | ooo | ooo |
| | 5 hours | ooo | ooo | ooo | ooo | ooo |
| | 7 hours | ooo | ooo | ooo | ooo | ooo |

Ex. = Example

Comparative Example 1

A copper-clad laminate having a thickness of 0.4 mm was produced in the same manner as in Example 1 except that the resin composite copper foils used in Example 1 were replaced with electrolytic copper foils (F0-WS foil) having a thickness of 12 μm each. Table 2 shows the evaluation results.

Comparative Example 2

Resin composite copper foils were prepared in the same manner as in Example 1 except that a block copolymer polyimide solution having a solid content of 15% was prepared in place of the block copolymer polyimide solution having a solid content of 10% used in Example 1 and that bis(4-maleimidophenyl)methane was not used. A copper-clad laminate having a thickness of 0.4 mm was produced in the same manner as in Example 1 except that the above resin composite copper foils were used in place of the resin composite copper foils used in Example 1. Table 2 shows the evaluation results.

Comparative Example 3

Resin composite copper foils were prepared in the same manner as in Example 3 except that the block copolymer polyimide used in Example 3 was replaced with the polyimide obtained in Comparative Synthetic Example. A copper-clad laminate having a thickness of 0.4 mm was produced in the same manner as in Example 3 except that the above resin composite copper foils were used in place of the resin composite copper foils used in Example 3. Table 2 shows the evaluation results.

TABLE 2

| | | Evaluation Results | | |
|---|---|---|---|---|
| | | CEx. 1 | CEx. 2 | CEx. 3 |
| Resin composite copper foil | Block copolymer polyimide | | 100 | — |
| | Polyimide | — | — | 50 |
| | Maleimide compound BMI-H | — | — | 50 |
| | Total thickness (μm) | 12 | 15 | 16 |
| Copper foil adhesive strength (kg/cm) | | 0.5 | 1.11 | 0.5 |
| Heat resistance in air | 240° C. treatment | ooo | ooo | ooo |
| | 280° C. treatment | oox | xxx | xxx |
| Heat resistance after moisture absorption | 1 hour | ooo | ooo | xxx |
| | 3 hours | ooo | ooo | xxx |
| | 5 hours | oox | ooo | xxx |
| | 7 hours | oxx | xxx | xxx |

CEx. = Comparative Example (Measurement Methods)

1) Total Thickness:

A 500×500 mm sample was measured for thickness at five points with a micrometer according to JIS C6481 and an average value was obtained.

2) Copper Foil Adhesive Strength:

Measurement was carried out three times according to JIS C6481 and an average value was obtained.

3) Heat resistance in air:

Heat treatment was carried out in a hot-air dryer at 240° C. for 30 minutes and 280° C. for 30 minutes according to JIS C6481. Then, the presence or absence of a defective condition of appearance change was visually observed (O: no defective condition, x: swelling or peeling off occurred).

4) Heat resistance after moisture absorption:

The entire copper foil of a 50 mm×50 mm square sample other than a copper foil on the half of one surface of the sample was removed by etching. The sample was treated with a pressure cooker testing machine (PC-3 type, supplied by Hirayama Manufacturing Corporation) at 121° C. at 2 atmospheric pressure for a predetermined time, then the sample was allowed to float in a solder bath at 260° C. for 60 seconds, and the presence or absence of a defective condition of appearance change was visually observed. (O: no defective condition, x: swelling or peeling off occurred).

Examples 6-9

The block copolymer polyimide solution obtained in Synthetic Example was further diluted with NMP to prepare a block copolymer polyimide solution having a solid content of 10%. This block copolymer polyimide solution and bis(4-maleimidophenyl)methane (BMI-H, supplied by K I KASEI KK) were molten and mixed at 60° C. for 20 minutes in accordance with solid content weight ratios shown in Table 3, thereby preparing resin solutions respectively. The thus-prepared resin solutions were respectively applied to a mat surface of an electrolytic copper foil (F0-WS foil, Rz=1.5 μm, supplied by Furukawa circuit foil Co., Ltd.) having a thickness of 12 μm with a reverse roll coating machine, then dried under a nitrogen atmosphere at 120° C. for 3 minutes and 160° C. for 3 minutes and then lastly heat-treated at 300° C. for 2 minutes, thereby preparing resin composite copper foils respectively.

On the other hand, 400 g of 2,2-bis(4-cyanophenyl)propane was molten at 150° C. and allowed to react with stirring for 4 hours, the reaction product was dissolved in methyl ethyl ketone and 600 g of a brominated bisphenol A type epoxy resin (EPICLON 1123P, supplied by Dainippon Ink and Chemicals, Incorporated) and 0.1 part of zinc octylate were added to prepare a varnish. The varnish was impregnated into a glass woven fabric base material having a thickness of 100 µm and dried at 150° C. for 6 minutes, whereby B-stage resin composition layers (prepregs) having a resin amount of 45%, a thickness of 105 µm and a gelation time (at 170° C.) of 120 seconds were prepared. Four prepregs were stacked. The resin composite copper foils of the same kind, obtained above, were placed on the upper surface and lower surface of the stacked prepregs, one resin composite copper foil on each surface, such that the resin layer surfaces of the resin composite copper foils faced to the upper and lower surfaces of the stacked prepregs respectively, and the resultant set was laminate-molded at a temperature of 220° C. at a pressure of 40 kgf/cm$^2$ and under a vacuum degree of 30 mmHg or less for 1 hour, whereby copper-clad laminates each having a thickness of 0.4 mm were respectively produced. Holes each having a diameter of 0.2 mm were made in these copper-clad laminates with a drill. Then, the copper foils of the copper-clad laminates were entirely removed with a hydrogen peroxide•sulfuric acid etching liquid. Further, copper layers each having a thickness of 1 µm were formed on the resultant copper-clad laminates with an electroless plating liquid (ATS ABCOPPER CT, supplied by Okuno Chemical Industries co., ltd.). Heating was carried out in a heating furnace at 130° C. for 2 hours. Then, electrolytic plating was carried out with a sulfuric acid copper plating liquid at 1.5 A/dm$^2$ for 70 minutes, thereby forming copper layers each having a thickness of 20 µm on the copper-clad laminates respectively. Etching resist film having a thickness of 10 µm was attached to each of the laminates having the above copper layers formed thereon, followed by exposure and development, to cover with the etching resist only portions (line having a width of 34 µm) where copper circuits were to be formed. Then, etching was carried out with a copper chloride etching liquid and the etching resist was peeled off, whereby printed wiring boards having copper circuits having an average width of 25 µm each were produced respectively. Table 3 shows the results.

TABLE 3

| | | Evaluation results | | | |
|---|---|---|---|---|---|
| | | Ex. 6 | Ex. 7 | Ex. 8 | Ex. 9 |
| Resin composite copper foil | Block copolymer polyimide | 80 | 65 | 50 | 25 |
| | Bismaleimide | 20 | 35 | 50 | 75 |
| | Total thickness (µm) | 15 | 14 | 14 | 14 |
| | Copper plating layer adhesive strength (kg/cm) | 1.15 | 1.24 | 1.30 | 1.31 |
| Heat resistance after moisture absorption | 1 hour | ooo | ooo | ooo | ooo |
| | 3 hours | ooo | ooo | ooo | ooo |
| | 5 hours | ooo | ooo | ooo | ooo |

Ex. = Example

Examples 10-13

The procedures till the step of the formation of the copper layers each having a thickness of 1 µm using the electroless plating liquid, carried out in Examples 6-9, were carried out in the same manner as in Examples 6-9. Then, 15 µm-thick plating resist films were respectively attached to the resultant laminates, and exposure and development were carried out to cover portions other than portions where copper circuits were to be formed, with a plating resist. The plating resist was removed. Electrolytic copper plating was carried out with a sulfuric acid copper plating liquid at 1.5 A/dm$^2$ for 50 minutes, to form 17 µm-thick copper circuits respectively. Then, etching was carried out using a hydrogen peroxide•sulfuric acid etching liquid (supplied by Mitsubishi Gas Chemical Co., Inc., trade name CPE800) to form circuits having a line width/line space of about 12/12 µm. Then, heating was carried out in a furnace at 130° C. for 2 hours, whereby printed wiring boards were respectively produced. Table 4 shows the results.

TABLE 4

| | | Evaluation Results | | | |
|---|---|---|---|---|---|
| | | Ex. 10 | Ex. 11 | Ex. 12 | Ex. 13 |
| Resin composite copper foil | Block copolymer polyimide | 80 | 65 | 50 | 25 |
| | Bismaleimide | 20 | 35 | 50 | 75 |
| | Total thickness (µm) | 15 | 14 | 14 | 14 |
| | Copper plating layer adhesive strength (kg/cm) | 1.14 | 1.24 | 1.28 | 1.28 |
| Heat resistance after moisture absorption | 1 hour | ooo | ooo | ooo | ooo |
| | 3 hours | ooo | ooo | ooo | ooo |
| | 5 hours | ooo | ooo | ooo | ooo |

Ex. = Example

Comparative Examples 4 and 5

Printed wiring boards were respectively produced in the same manners as those in Examples 6 and 10 except that bismaleimide used in Examples 6 and 10 was not used. Table 5 shows the evaluation results.

TABLE 5

| | | Evaluation Results | |
|---|---|---|---|
| | | CEx. 4 | CEx. 5 |
| Resin composite copper foil | Block copolymer polyimide | 100 | 100 |
| | Total thickness (µm) | 14 | 14 |
| Copper plating layer adhesive strength (kg/cm) | | 1.00 | 1.00 |
| Heat resistance after moisture absorption | 1 hour | ooo | ooo |
| | 3 hours | xxx | xxx |

CEx. = Example (Measurement Methods)
1) Total Thickness:
An average value obtained by measuring a resin composite copper foil (size 500×500 mm) for thickness in five points in accordance with JIS C6481.
2) Copper Plating Adhesive Strength
A laminate obtained by etching the entire surfaces of copper foils of a copper-clad laminate having a thickness of 0.4 mm was plated by electroless plating and electrolytic copper plating without forming circuits, to prepare a laminate having a copper plating layer on its entire surface. The laminate was measured for copper plating adhesive strength in accordance with JIS C6481 three times, and an average value was obtained.
3) Heat Resistance After Moisture Absorption:
A printed wiring board was cut to obtain a 50 mm×50 mm square sample. The sample was treated with a pressure cooker testing machine (PC-3 type, supplied by Hirayama Manufacturing Corporation) at 121° C. at 2 atmospheric pressure for a predetermined time, then the sample was allowed to float in a solder bath at 260° C. for 60 seconds, and the presence or absence of a defective condition of appearance change was visually observed. (○: no defective condition, x: swelling or peeling off occurred).

What is claimed is:

1. A resin composite copper foil for printed wiring boards, comprising a copper foil and a resin layer containing a block copolymer polyimide and a maleimide compound, the resin layer being formed on one surface of the copper foil,
wherein the block copolymer polyimide resin consists essentially of a structural unit represented by the formula (1) and a structural unit represented the formula (2),

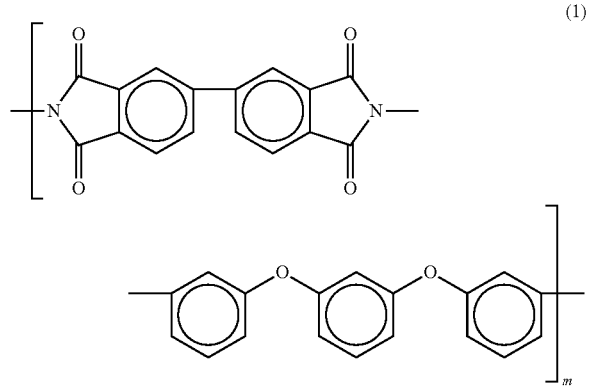

(1)

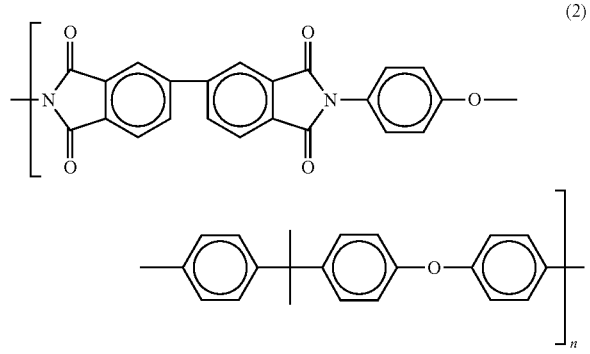

(2)

wherein m and n are integers which satisfy m:n=1:9 to 3:1.

2. A resin composite copper foil according to claim 1, wherein the resin layer has a thickness of 0.1 μm to 10μm.

3. A resin composite copper foil according to claim 1, wherein the weight ratio of the block copolymer polyimide and the maleimide compound contained in the resin layer is 10:90 to 90:10.

4. A process for the production of the resin composite copper foil for printed wiring boards as defined in claim 1, comprising applying a resin solution containing the block copolymer polyimide and the maleimide compound to one surface of the copper foil and then heat-treating the resin solution-applied copper foil at 250 to 360° C., to form a resin layer which does not melt at 200° C. or lower.

5. A copper-clad laminate for printed wiring boards, which is obtained by laminating a resin composite copper foil comprising a copper foil and a resin layer containing a block copolymer polyimide and a maleimide compound, the resin layer being formed on one surface of the copper foil, and a B-stage resin composition layer, and then curing the resultant set,
wherein the block copolymer polyimide resin consists essentially of a structural unit represented by the formula (1) and a structural unit represented the formula (2),

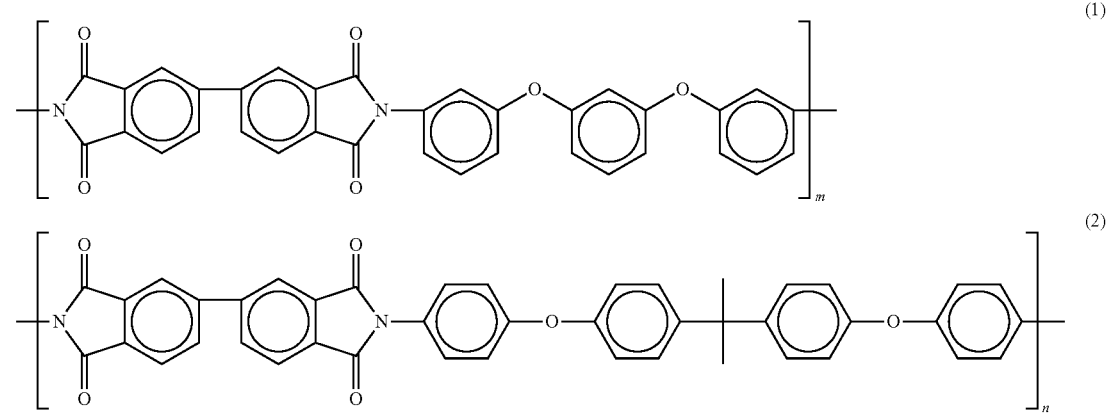

wherein m and n are integers which satisfy m:n=1:9 to 3:1.

6. A process for the production of a printed wiring board, which process comprises removing the copper foil of the copper-clad laminate as recited in claim 5 completely by etching, to expose a resin layer surface and obtain a laminate, forming an electroless copper plating layer by electroless copper plating without roughening treatment of the resin layer surface of the laminate, forming an electrolytic copper plating layer on the electroless copper plating layer by electrolytic copper plating, and then selectively removing the electroless copper plating layer and the electrolytic copper plating layer by etching, thereby forming a copper circuit.

7. A process according to claim 6, wherein heat-treatment is carried out at 100° C. to 200° C. after the formation of the electroless copper plating layer or the formation of the electrolytic copper plating layer.

8. A printed wiring board obtained by the process as recited in claim 6.

9. A process for the production of a printed wiring board, which process comprises removing the copper foil of the copper-clad laminate as recited in claim 5 completely by etching, to expose a resin layer surface and obtain a laminate, forming an electroless copper plating layer by electroless copper plating without roughening treatment of the resin layer surface of the laminate, then selectively forming an electrolytic copper plating layer on the electroless copper plating layer, and then removing at least the electroless copper plating layer in a portion where the electrolytic copper plating layer is not formed, by etching, thereby forming a copper circuit.

10. A process according to claim 9, wherein heat-treatment is carried out at 100° C. to 200° C. after the formation of the electroless copper plating layer or the formation of the electrolytic copper plating layer.

11. A printed wiring board obtained by the process as recited in claim 9.

* * * * *